United States Patent
Wang et al.

(10) Patent No.: US 10,804,339 B2
(45) Date of Patent: Oct. 13, 2020

(54) NAKED-EYE THREE-DIMENSIONAL DISPLAY DEVICE

(71) Applicant: Shenzhen China Star Optoelectronics Technology Co., Ltd., Shenzhen, Guangdong (CN)

(72) Inventors: Limin Wang, Guangdong (CN); Tai Jiun Hwang, Guangdong (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 636 days.

(21) Appl. No.: 15/531,602

(22) PCT Filed: Apr. 11, 2017

(86) PCT No.: PCT/CN2017/080060
§ 371 (c)(1),
(2) Date: Sep. 10, 2018

(87) PCT Pub. No.: WO2018/170960
PCT Pub. Date: Sep. 27, 2018

(65) Prior Publication Data
US 2019/0386075 A1    Dec. 19, 2019

(30) Foreign Application Priority Data
Mar. 21, 2017    (CN) .......................... 2017 1 0169953

(51) Int. Cl.
*G02B 30/26* (2020.01)
*H01L 27/32* (2006.01)

(52) U.S. Cl.
CPC .......... *H01L 27/3232* (2013.01); *G02B 30/26* (2020.01); *H01L 27/3211* (2013.01); *H01L 27/3244* (2013.01)

(58) Field of Classification Search
CPC ............................. G02B 27/225; G02B 30/26
See application file for complete search history.

(56) References Cited

U.S. PATENT DOCUMENTS

2016/0093250 A1* 3/2016 Lee ...................... H01L 27/3218
345/77
2016/0259172 A1* 9/2016 Wu ........................ G02B 27/26
(Continued)

FOREIGN PATENT DOCUMENTS

CN    103176308 A    6/2013

*Primary Examiner* — Michael H Caley
*Assistant Examiner* — Mariam Qureshi

(57) ABSTRACT

Disclosed is a naked-eye three-dimensional display device, which is from top to bottom sequentially provided with a first substrate, a light-emitting layer, a second substrate, a first indium tin oxide (ITO) electrode layer, a three-dimensional prism liquid crystal layer, a second ITO electrode layer and a third substrate. One side of the first substrate facing the light-emitting layer is provided with thin film transistors arranged in a matrix form. Since the first ITO electrode layer is disposed directly on the second substrate, a substrate and a transparent photoresist layer are not used. Thus, the weight of the device is reduced, and the display brightness and the alignment accuracy are improved. When liquid crystal prism electrode units of the first ITO electrode layer and display regions of pixel units are configured to overlap with each other, the influence of transmitted light on naked eye 3D display can be avoided and the 3D display effect is improved.

12 Claims, 4 Drawing Sheets

(56) References Cited

U.S. PATENT DOCUMENTS

2017/0084572 A1\* 3/2017 Liu ..................... H01L 27/3288
2018/0231792 A1\* 8/2018 Wang .................... G02F 1/1323

\* cited by examiner

NAKED-EYE THREE-DIMENSIONAL DISPLAY DEVICE

CROSS-REFERENCE TO RELATED APPLICATIONS

This application claims the priority of Chinese patent application CN 201710169953.4, entitled "Naked-eye three-dimensional display device" and filed on Mar. 21, 2017, the entirety of which is incorporated herein by reference.

FIELD OF THE INVENTION

The present disclosure relates to the technical field of displaying, and in particular, to a naked-eye three-dimensional display device.

BACKGROUND OF THE INVENTION

Three-dimensional display technology has been widely used. Three-dimensional display technology enables a viewer to gain depth perception through exploitation of a parallax due to different views from the left and right eyes of humans. At present, popular three-dimensional display technologies can be divided into glasses-required and glasses-free three-dimensional displays. Three-dimensional display technology is widely used in many fields, such as military, medical, entertainment, education, advertising and data visualization.

Naked-eye three-dimensional display technology can bring more intuitive and stereoscopic sensory experiences to people. Three-dimensional liquid crystal prism technology is a hot research in the naked-eye three-dimensional display technology with a wide application prospect. Organic Light Emitting Diode (OLED) transparent display is also a new technology with wide market prospect. Equipping an OLED transparent display device with a naked-eye three dimensional liquid display prism can make an ordinary transparent display device have direct three-dimensional effects. FIG. 1 schematically shows the structure of a display device in which an OLED transparent display device is equipped with a three-dimensional liquid crystal prism in the prior art. The display device from top to bottom sequentially comprises an OLED transparent display device 11, a transparent photo-resist layer 12, a first glass substrate 13, a first indium tin oxide (ITO) electrode layer 14, a three-dimensional prism liquid crystal layer 15, a second ITO electrode layer 16 and a second glass substrate 17. Since the OLED transparent display device 11 itself comprises a lower substrate 111 and an upper substrate 112, when the display device is equipped further with the first glass substrate 13 and the second glass substrate 17, the thickness and weight of the entire display device are both obviously increased and the cost is quite high. Simultaneously, since the display device has four layers of substrates, the transparency thereof is therefore affected. Moreover, since the OLED transparent display device and the three-dimensional liquid crystal prism structure are assembled together as two individual parts, it is difficult to align the three-dimensional liquid crystal prism accurately with pixels, which results in poor display.

SUMMARY OF THE INVENTION

In order to overcome the technical problems existing in a three dimensional (3D) display device formed by an OLED transparent display device equipped with a three-dimensional liquid crystal prism in the prior art, the present disclosure provides a naked-eye three-dimensional display device.

The naked-eye three-dimensional display device is from top to bottom sequentially provided with a first substrate, a light-emitting layer, a second substrate, a first indium tin oxide (ITO) electrode layer, a three-dimensional prism liquid crystal layer, a second ITO electrode layer and a third substrate. One side of the first substrate facing the light-emitting layer is provided with thin film transistors arranged in a matrix form, and the first ITO electrode layer is disposed on the second substrate.

According to the naked-eye three-dimensional display device of the present disclosure, the first ITO electrode layer is directly disposed on a surface of the substrate of an OLED transparent display facing the three-dimensional prism liquid crystal layer, which renders it unnecessary to additionally provide one substrate and one transparent photoresist layer. In this manner, the weight of the entire display device is reduced, the cost is decreased, the influence of the display device to transmitted light is avoided and the brightness of the display device is improved. Meanwhile, since the first ITO electrode layer is directly disposed on the substrate of the OLED transparent display, the first ITO electrode layer and pixels of the OLED transparent display can be designed and manufactured in one piece, which ensures the alignment accuracy thereof and improves the display quality of the product.

As a further improvement on the present disclosure, the first ITO electrode layer comprises liquid crystal prism electrode units arranged in a matrix form. The light-emitting layer comprises pixel units arranged in a matrix form. Each of the pixel units sequentially comprises a transparent region and a display region in a first direction, and the first direction is a direction of columns of the pixel units arranged in the matrix form. The liquid crystal prism electrode units and the display regions of the pixel units sequentially overlap with each other when viewed along a normal direction of the third substrate.

The pixel units are mainly used for displaying corresponding colors. When the pixel units comprises the transparent regions and the display regions, the transparent regions are used for displaying colors, while the transparent regions can transmit a light source and improve the brightness of the display device. The liquid crystal prism electrode units are arranged corresponding to the pixel units, which is conducive to applying a voltage across the three-dimensional prism liquid crystal layer and facilitates the formation of different colors. In particular, since the liquid crystal prism electrode units and the display regions of the pixel units sequentially overlap with each other when viewed along the normal direction of the third substrate, the transparent regions are no longer provided with the liquid crystal prism electrode units, so that the naked-eye 3D effect cannot be produced in the transparent regions, and the influence of the transmitted light on the naked-eye 3D display is avoided.

As a further improvement on the pixel units, each of the pixel units comprises a plurality of sub-pixels arranged sequentially along a second direction, and the second direction is a direction of rows of the pixel units arranged in a matrix form. Each of the sub-pixels sequentially comprises a sub-pixel transparent region and a sub-pixel display region in the first direction, the sub-pixel transparent regions cooperatively constitute the transparent region of the pixel unit, and the sub-pixel display regions cooperatively constitute the display region of the pixel unit. In this case, the liquid crystal prism electrode units and the display regions of the pixel units sequentially overlap with each other when viewed along the normal direction of the third substrate.

The pixel units in such arrangements can display various colors according to the colors displayed by each sub-pixel, and the color vividness of the display device can be improved. When the sub-pixels each comprise the sub-pixel transparent region and the sub-pixel display region, a desired color is displayed by the sub-pixel display region. The sub-pixel transparent region is used for increasing a projection of the light source, which can help to improve the brightness of the display device. Similarly, when viewed along the normal direction of the third substrate, the liquid crystal prism electrode units are disposed on the display regions constituted cooperatively by the sub-pixel display regions, rather than on the sub-pixel transparent regions, so that the display regions can produce a naked-eye 3D effect while the transparent regions will not produce the naked-eye 3D effect, thereby avoiding the influence of the transmitted light on the naked-eye 3D display.

As a further improvement on the present disclosure, when viewed along the normal direction of the third substrate, the sub-pixels are sequentially arranged in correspondence with the thin film transistors. In the arrangement, the thin film transistors each control a corresponding sub-pixel.

Further, adjacent sub-pixels in each of the pixel units present different colors. This is similar to a liquid crystal display device in the prior art in which R, G, and B sub-pixels, represent different colors, and then different colors are displayed based on different gray-scales.

As a further improvement on the present disclosure, the second ITO electrode layer is sequentially arranged in correspondence with the first ITO electrode layer. The second ITO electrode layer and the first ITO electrode layer can cooperatively constitute one electrode layer which controls movement of the three-dimensional prism liquid crystal layer, so that different colors are displayed.

In one preferred embodiment, the first substrate, the second substrate and the third substrate are all made of glass. Glass is a substrate material which is commonly used in display devices, and selecting glass as the substrates can reduce the purchase cost and improve the utilization rate of the product. At the same time, since glass has a good light transmittance, the brightness of the display device is thus improved.

In conclusion, the naked-eye three-dimensional display device provided by the present disclosure renders it unnecessary to additionally provide one substrate and one transparent photoresist layer, as a consequence of which the weight and the cost of the display device are decreased, and the brightness of the device is increased. Besides, according to the naked-eye three-dimensional display device provided by the present disclosure, since the first ITO electrode layer is directly disposed on the substrate of the OLED transparent display, the first ITO electrode layer and pixels of the OLED transparent display can be designed and manufactured in one piece, which ensures the alignment accuracy thereof and improves the display quality of the product. In particular, when the liquid crystal prism electrode units are disposed only in the display regions of the pixel units, not only can the transparent regions of the pixel units transmit the light source better so as to improve the brightness, but also is the naked-eye 3D effect avoided to be produced in the transparent regions, and the influence of the transparent regions to the naked-eye 3D display effect can be avoided.

BRIEF DESCRIPTION OF THE DRAWINGS

The present disclosure will be described in a more detailed way below based on embodiments and with reference to the accompanying drawings, in which.

Figure 1:
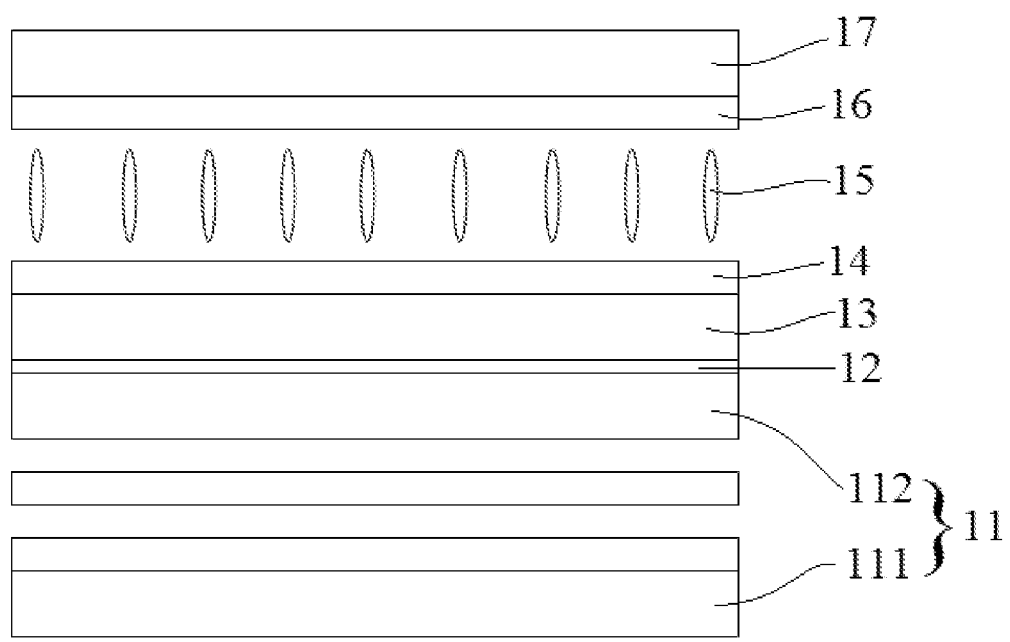
FIG. 1 schematically shows the structure of a display device in which an OLED transparent display device is equipped with a three-dimensional liquid crystal prism in the prior art.

In the accompanying drawings, same components use same reference signs. The accompanying drawings are not drawn according to actual proportions.

DETAILED DESCRIPTION OF THE EMBODIMENTS

The present disclosure will be described in a more detailed way below with reference to the accompanying drawings. The terms "upper", "lower", "left", and "right" in the following text are directions relative to the directions shown in the drawings, and should not be construed as limiting the scope of the disclosure.

Figure 2:
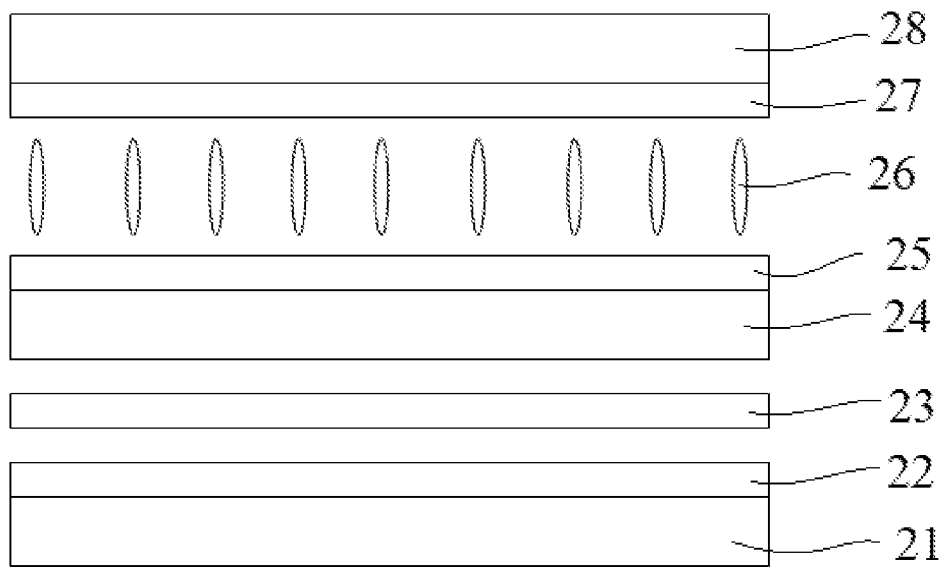
FIG. 2 schematically shows the cross-sectional structure of a naked-eye three-dimensional display device provided by the present disclosure.

FIG. 2 schematically shows the cross-sectional structure of a naked-eye three-dimensional display device 20 of the first embodiment. As can be seen from FIG. 2, the display device 20 is from top to bottom sequentially provided with a first substrate 21, a light-emitting layer 23, a second substrate 24, a first indium tin oxide (ITO) electrode layer 25, a three-dimensional prism liquid crystal layer 26, a second ITO electrode layer 27 and a third substrate 28. In the present embodiment, one side of the first substrate 21 facing the light-emitting layer 23 is provided with thin film transistors 22 arranged in a matrix form, and the first ITO electrode layer 25 is disposed on an upper side of the second substrate 24.

Compared with a display device of the prior art in which an OLED transparent display device is equipped with a three-dimensional liquid crystal prism as shown in FIG. 1, the display device 20 in the present embodiment does not include a first glass substrate 13; instead, the first ITO electrode layer is directly disposed on an upper substrate 112 of the OLED transparent display device, forming the naked-eye three-dimensional display device 20 of the present disclosure as shown in FIG. 2. In this way, the weight and the cost of the display device 20 in the present embodiment are greatly reduced. Besides, in the absence of one substrate, the transmittance of a light source is increased and the brightness of the display device is improved. In particular, when the first ITO electrode layer 25 is directly disposed on the second substrate 24, the first ITO electrode layer and pixels of the OLED transparent display device can be designed and manufactured in one piece, which ensures the alignment accuracy thereof and improves the display quality of the product.

Figure 3:
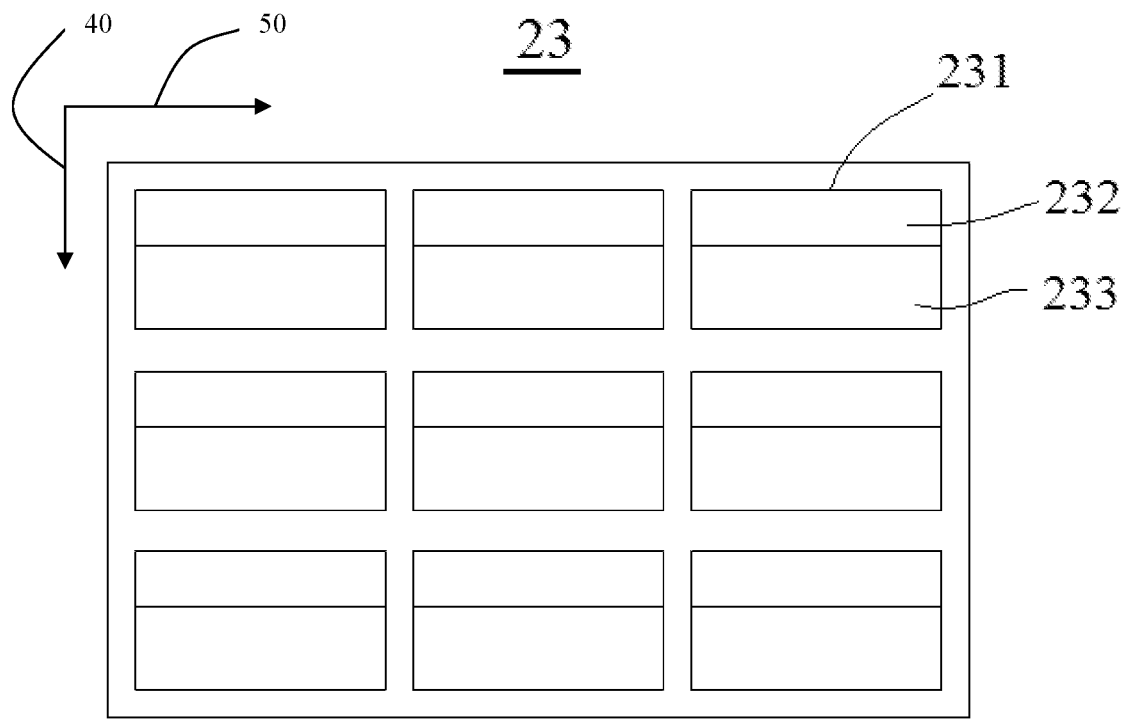
FIG. 3 schematically shows the structure of a light-emitting layer 23.

FIG. 3 schematically shows the structure of the light-emitting layer 23 in the present embodiment. It can be seen from FIG. 3 that the light-emitting layer 23 is provided thereon with pixel units arranged in a matrix form. Here, a first direction 40 is a direction of columns of the pixel units arranged in a matrix form, and a second direction 50 is a direction of rows of the pixel units arranged in a matrix form. A luminous material is disposed inside the pixel units 231, so as to provide needed light source to the display device 20. In particular, when the pixel units 231 are configured to display a plurality of colors, the pixel units 231 functions not only as a backlight source, but also as a color resist in a conventional liquid crystal display. In order to further improve the brightness of the display device 20, each pixel unit 231 comprises a transparent region 232 and a display region 233 in the first direction 40. Such arrangement makes the light-emitting layer 23 present a structure that the transparent regions and the display regions are arranged alternately in the first direction 40. The arrangement of the transparent regions further improves the brightness of the display device.

Figure 4:
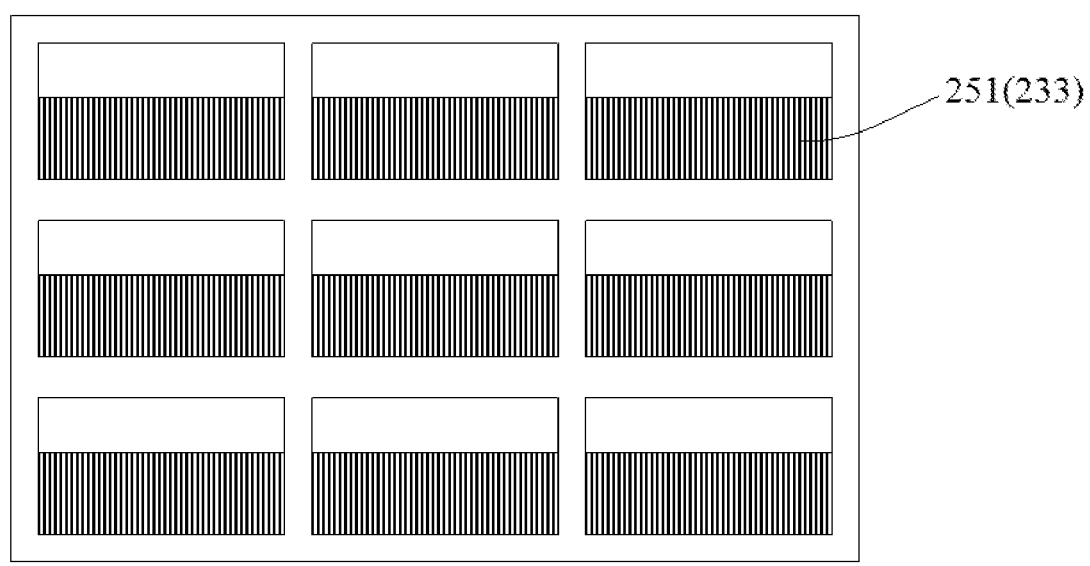
FIG. 4 schematically shows the positional relationship between liquid crystal prism electrode units and display regions of pixel units when viewed along a normal direction of a third substrate.

In the present embodiment, the first ITO electrode layer 25 comprises liquid crystal prism electrode units 251 arranged in a matrix form. The liquid crystal prism electrode units 251 and the display regions 233 sequentially overlap with each other when viewed along a normal direction of the third substrate 28 of the display device 20. FIG. 4 is a schematic diagram showing the liquid crystal prism electrode units 251 and the display regions 233 overlapping with each other. Such arrangement makes the display regions 233 have a naked-eye 3D display effect. The transparent regions 232 do not have the naked-eye 3D display effect for lack of the liquid crystal prism electrodes, and the influence of transmitted light on the naked-eye 3D display is avoided.

Figure 5:
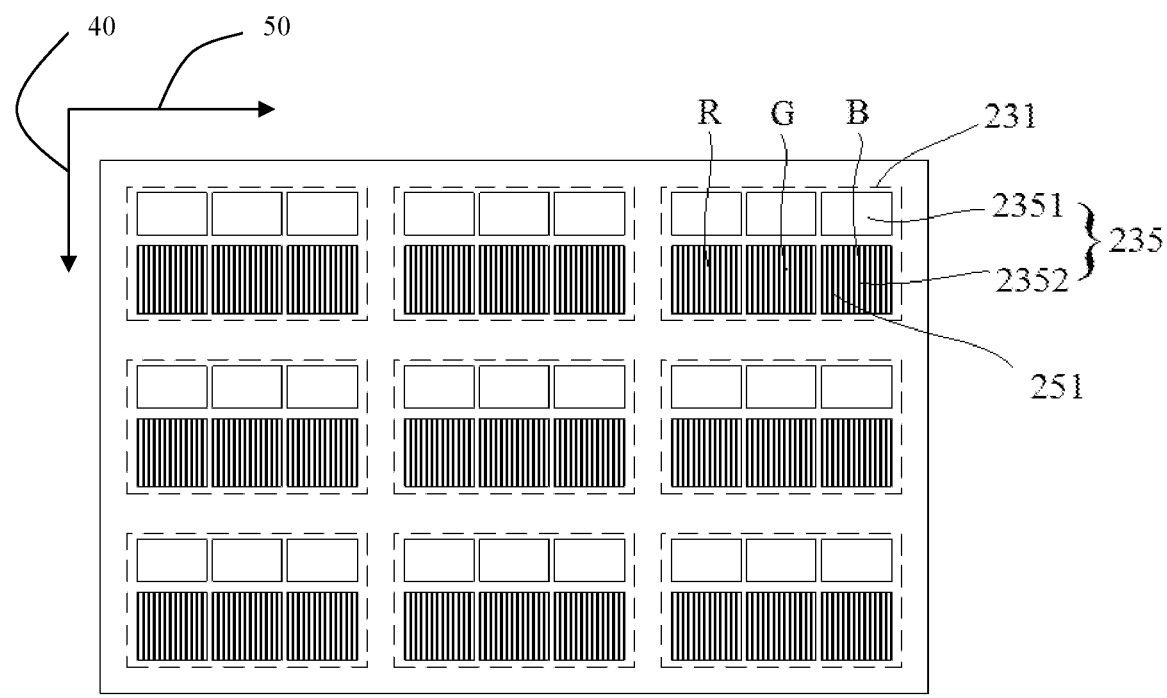
FIG. 5 schematically shows the structure of the pixel units.

In order to ensure that the pixel units 231 can display light in a plurality of colors, preferably, each pixel unit 231 comprises a plurality of sub-pixels 235 arranged sequentially along the second direction 50. In the present embodiment, preferably, the number of the sub-pixels is three. As shown in FIG. 5, adjacent sub-pixels present different colors. Here, three sub-pixels 235 are configured to emit light in R (red), G (green), and B (blue) colors respectively. R, G, and B are three basic colors, and mixed light of different colors can be displayed through a combination of different grayscales, by means of which the pixel units 231 can be ensured to display the light in a plurality of colors. Here, each sub-pixel 235 sequentially comprises a sub-pixel transparent region 2351 and a sub-pixel display region 2352 along the first direction 40. The sub-pixel transparent regions 2351 are used for transmitting light, while the sub-pixel display regions are used for emitting light in corresponding colors. Hence, the transparent region of each pixel unit 231 is constituted by three sub-pixel transparent regions 2351, and the display region is constituted by three sub-pixel display regions 2352. In each pixel unit 231 which is arranged in such manner, liquid crystal prism electrode units 251 and the three sub-pixels of each pixel unit 231 overlap with each other when viewed along the along a normal direction of the third substrate 28 of the display device 20.

Certainly, each pixel unit 231 may comprises four sub-pixels, and the four sub-pixels may be configured to emit light in R (red), G (green), B (blue), and W (white) colors respectively. The sub-pixels may also emit light in other colors, which is not limited here.

Figure 6:
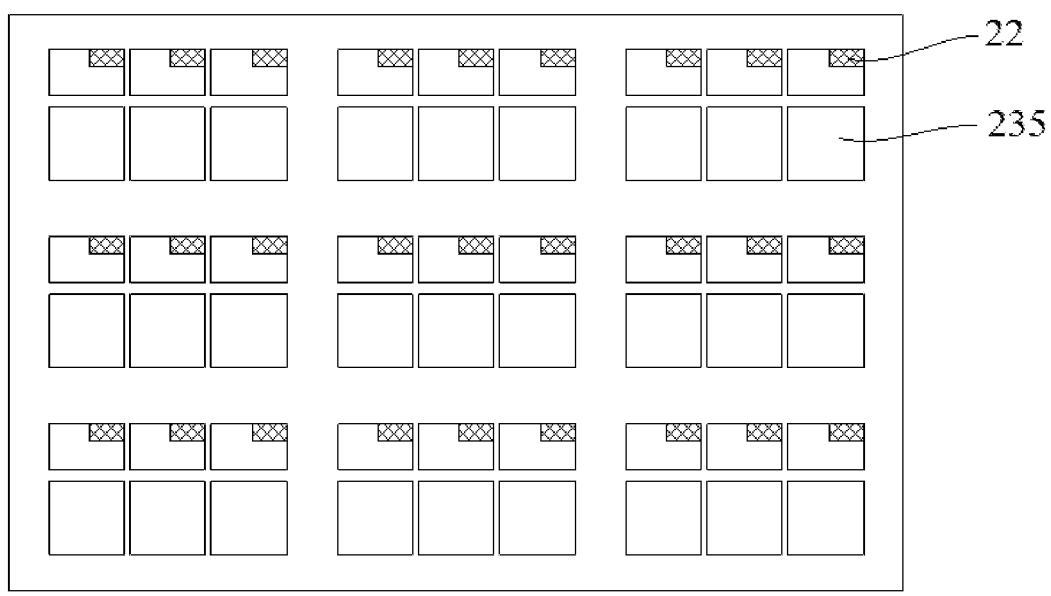
FIG. 6 schematically shows the corresponding relationship between sub-pixels and thin film transistors when viewed along the normal direction of the third substrate.

As each pixel unit 231 comprises the plurality of sub-pixels 235 arranged sequentially along the second direction, the sub-pixels 235 arranged in the matrix form are sequentially arranged in correspondence with the thin film transistors 22 arranged in the matrix form on the first substrate 21 when viewed along the normal direction of the third substrate 28. As shown in FIG. 6, each thin film transistor therefore controls a corresponding sub-pixel, which facilitates the display of the display device 20.

In order to ensure rotating directions of liquid crystal molecules in the three-dimensional prism liquid crystal layer 26, preferably, the second ITO electrode layer 27 is sequentially arranged in correspondence with the first ITO electrode layer 25.

In order to further control the cost, the first substrate, the second substrate and the third substrate in the present embodiment are all made of glass.

Finally, it is noted that the above embodiment is only used to explain the technical solution of the present disclosure and shall not be construed as limitation. Although the present disclosure has been described in detail with reference to preferred embodiment, ordinary people skilled in the art should understand that modifications or equivalent substitutions can be made on the technical solutions of the present disclosure. In particular, as long as there are no structural conflicts, the technical features disclosed in each and every embodiment of the present disclosure can be combined with one another in any way, and the combined features formed thereby are within the protection scope of the present disclosure. As long as the technical solutions do not depart from the scope and the spirit of the disclosure, all of them shall fall within the scope of the claims of the present disclosure.

The invention claimed is:

1. A naked-eye three-dimensional display device, sequentially comprising, from top to bottom, a first substrate, a light-emitting layer, a second substrate, a first indium tin oxide (ITO) electrode layer, a three-dimensional prism liquid crystal layer, a second ITO electrode layer and a third substrate, wherein:
   one side of the first substrate facing the light-emitting layer is provided with thin film transistors arranged in a matrix form, and
   the first ITO electrode layer is disposed on the second substrate;
   the light-emitting layer comprises pixel units arranged in a matrix form, each of the pixel units sequentially comprises a transparent region and a display region in a first direction, and the first direction is a direction of columns of the pixel units arranged in the matrix form;
   wherein the first ITO electrode layer comprises liquid crystal prism electrode units arranged in a matrix form;
   wherein each of the pixel units comprises a plurality of sub-pixels arranged sequentially along a second direction, the second direction being a direction of rows of the pixel units arranged in the matrix form;
   wherein each of the sub-pixels sequentially comprises a sub-pixel transparent region and a sub-pixel display region in the first direction, the sub-pixel transparent regions cooperatively constituting the transparent region of each pixel unit, and the sub-pixel display region cooperatively constituting the display region of each pixel unit;
   wherein the sub-pixels are sequentially arranged in correspondence with the thin film transistors when viewed along a normal direction of the third substrate;
   wherein each of the thin film transistors overlaps with a corner part of the sub-pixel transparent region of the sub-pixel arranged in correspondence with the thin film transistor when viewed along a normal direction of the third substrate.

2. The display device according to claim 1, wherein adjacent sub-pixels in each of the pixel units present different colors.

3. The display device according to claim 2, wherein the liquid crystal prism electrode units and the display regions of the pixel units sequentially overlap with each other when viewed along a normal direction of the third substrate.

4. The display device according to claim 1, wherein the liquid crystal prism electrode units and the display regions of the pixel units sequentially overlap with each other when viewed along a normal direction of the third substrate.

5. The display device according to claim 1, wherein the liquid crystal prism electrode units and the display regions of the pixel units sequentially overlap with each other when viewed along a normal direction of the third substrate.

6. The display device according to claim 1, wherein the liquid crystal prism electrode units and the display regions of the pixel units sequentially overlap with each other when viewed along the normal direction of the third substrate.

7. The display device according to claim 1, wherein the second ITO electrode layer is sequentially arranged in correspondence with the first ITO electrode layer.

8. The display device according to claim 7, wherein the first substrate, the second substrate and the third substrate are all made of glass.

9. The display device according to claim 1, wherein, in each row of the pixel units arranged in the matrix form, the transparent regions of the row of the pixel units are arranged laterally, and there is no display region between any two transparent regions of the row of the pixel units.

10. The display device according to claim 1, wherein, in each row of the pixel units arranged in the matrix form, the display regions of the row of the pixel units are arranged laterally, and there is no transparent region between any two display regions of the row of the pixel units.

11. A naked-eye three-dimensional display device, sequentially comprising, from top to bottom, a first substrate, a light-emitting layer, a second substrate, a first indium tin oxide (ITO) electrode layer, a three-dimensional prism liquid crystal layer, a second ITO electrode layer and a third substrate, wherein:
  one side of the first substrate facing the light-emitting layer is provided with thin film transistors arranged in a matrix form, and
  the first ITO electrode layer is disposed on the second substrate;
  wherein the light-emitting layer comprises pixel units arranged in a matrix form, each of the pixel units comprises a transparent region and a display region, and the transparent region and the display region are arranged longitudinally;
  wherein, each of the pixel units comprises a plurality of sub-pixels arranged laterally, each of the sub-pixels comprises a sub-pixel transparent region and a sub-pixel display region, the sub-pixel transparent region and the sub-pixel display region are arranged longitudinally, the sub-pixel transparent regions cooperatively constitute the transparent region of each pixel unit, and the sub-pixel display region cooperatively constitute the display region of each pixel unit;
  wherein, when viewed along a normal direction of the third substrate, the sub-pixels are arranged in correspondence with the thin film transistors, and each of the thin film transistors overlaps with a corner part of the sub-pixel transparent region of the sub-pixel arranged in correspondence with the thin film transistor.

12. The display device according to claim 11, wherein, in each row of the pixel units arranged in the matrix form, the transparent regions of the row of the pixel units are arranged laterally, and there is no display region between any two transparent regions of the row of the pixel units; the display regions of the row of the pixel units are arranged laterally, and there is no transparent region between any two display regions of the row of the pixel units.

* * * * *